United States Patent
Kojima et al.

(10) Patent No.: US 7,291,865 B2
(45) Date of Patent: Nov. 6, 2007

(54) LIGHT-EMITTING SEMICONDUCTOR DEVICE

(75) Inventors: Masanori Kojima, Aichi-ken (JP); Minoru Hirose, Aichi-ken (JP); Masao Kamiya, Aichi-ken (JP); Kosuke Yahata, Aichi-ken (JP)

(73) Assignee: Toyoda Gosei Co., Ltd., Nishikasugai-Gun, Aichi-Ken (JP)

( * ) Notice: Subject to any disclaimer, the term of this patent is extended or adjusted under 35 U.S.C. 154(b) by 212 days.

(21) Appl. No.: 11/236,882

(22) Filed: Sep. 28, 2005

(65) Prior Publication Data

US 2006/0071226 A1    Apr. 6, 2006

(30) Foreign Application Priority Data

Sep. 29, 2004  (JP)  ............................. 2004-284075
Sep. 30, 2004  (JP)  ............................. 2004-288880

(51) Int. Cl.
*H01L 29/22* (2006.01)
*H01L 27/15* (2006.01)

(52) U.S. Cl. ........................... 257/98; 257/99; 257/81; 257/78; 257/E33.062; 257/E33.072; 438/22; 438/25; 438/26; 438/27; 438/29

(58) Field of Classification Search ................. 257/98, 257/99, 81, 79, E33.062, E33.072; 438/22, 438/25, 26, 27, 29
See application file for complete search history.

(56) References Cited

U.S. PATENT DOCUMENTS 6,452,214 B2 * 9/2002 Kaneyama et al. ........... 257/79
7,042,012 B2 * 5/2006 Senda et al. .................. 257/79

FOREIGN PATENT DOCUMENTS

| JP | 6-232450 | 8/1994 |
|---|---|---|
| JP | 10-4208 | 1/1998 |
| JP | 2000-36619 | 2/2000 |
| JP | 3068914 (U) | 3/2000 |
| JP | 2001-217461 | 8/2001 |
| JP | 2003-224297 | 8/2003 |
| JP | 2004-71655 | 3/2004 |

* cited by examiner

*Primary Examiner*—Jerome Jackson
*Assistant Examiner*—Joseph Nguyen
(74) *Attorney, Agent, or Firm*—McGinn IP Law Group, PLLC

(57) ABSTRACT

A flip-chip type of Group III nitride based compound semiconductor light-emitting device comprises a transparent conductive film 10 made of ITO on a p-type contact layer. On the transparent conductive film, an insulation protection film 20, a reflection film 30 which is made of silver (Ag) and aluminum (Al) and reflects light to a sapphire substrate side, and a metal layer 40 made of gold (Au) are deposited in sequence. Because the insulation protection film 20 exists between the transparent conductive film 10 and the reflection film 30, metal atoms comprised in the reflection film 30 can be prevented from diffusing in the transparent conductive film 10. That enables the transparent conductive film 10 to maintain high transmissivity. As a result, a light-emitting device having high external quantum efficiency can be provided.

15 Claims, 12 Drawing Sheets

FIG. 17

| | | DRIVING VOLTAGE | LUMINOUS INTENSITY | | | RELIABILITY |
| --- | --- | --- | --- | --- | --- | --- |
| | | | λ=280nm | λ=380nm | λ=450nm | |
| PRESENT INVENTION | THE BEST MODE (MESH) | 1.0 | 1.0 | 1.0 | 1.0 | ○ |
| | MODE 2 (DOT) | 1.0 | 1.0 | 1.0 | 1.0 | ○ |
| COMPARATIVE EXAMPLE | (1) Rh | 1.0 | 0.69 | 0.75 | 0.80 | ○ |
| | (2) Ni/Rh | 0.97 | 0.50 | 0.60 | 0.65 | ◎ |
| | (3) Rh (DOT)/Ag | 1.0 | 0.45 | 1.0 | 1.0 | × |

LIGHT-EMITTING SEMICONDUCTOR DEVICE

This is a patent application based on Japanese patent applications No. 2004-288880 and 2004-284075 which were filed on Sep. 30, 2004, and Sep. 29, 2004, respectively, and which are incorporated herein by reference.

TECHNICAL FIELD

The present invention relates to a light-emitting semiconductor device. Especially, the present invention relates to a flip-chip type light-emitting device which radiates lights from a transparent substrate side, having improved external quantum efficiency and suppressed age-related deterioration.

Especially, the present invention relates to a light-emitting semiconductor device comprising a gallium nitride based compound semiconductor. Especially, the present invention relates to materials and structure of an electrode having electrically and optically excellent reliability about a flip-chip type of a light-emitting semiconductor device.

BACKGROUND ART

Progress in a light-emitting semiconductor device is remarkable in these days. Especially, a light-emitting diode (LED) has been miniaturized, and has lower power consumption and higher reliability. So an LED is widely used as a display luminous source. The LED which is used practically is made of a III-V group compound semiconductor. Especially a gallium nitride compound semiconductor ($Al_xGa_yIn_{1-x-y}N$ ($0 \leq x \leq 1$, $0 \leq y \leq 1$, $0 \leq x+y \leq 1$)) is a direct transition type semiconductor which covers from ultraviolet region to orange region. So it is mainly used as an LED which emits blue or green lights, and large numbers of such LED are employed as a display unit in the open air and a traffic signal. If efficiency of the LED is further promoted, it becomes to have larger possibility to be employed as excitation light source for a fluorescent lamp. Now expectation for a mercury (Hg)-free LED is growing from an environmental view, development of LEDs is proceeded vigorously.

Generally, a light-emitting device using a gallium nitride based compound semiconductor comprises a gallium nitride based compound semiconductor layer grown on a substrate made of a material such as sapphire through crystal growth, an n-type gallium nitride based compound semiconductor, an active layer, and a p-type gallium nitride based compound semiconductor in sequence. In the light-emitting device having such structure, electrons in the n-type gallium nitride based compound semiconductor recombine with holes in the p-type gallium nitride based compound semiconductor in the active layer and lights generated in the active layer are outputted from the device.

As a light-emitting semiconductor device having such structure, a device having structures such as outputting lights directed to the upside of the active layer and outputting lights directed to the downside of the active layer through a transparent substrate has been known. Especially structure in which lights are outputted through a transparent substrate (hereinafter referred to as "flip-chip type") uses an electrode layer formed on the p-type gallium nitride compound semiconductor as a reflection layer.

Generally, in a light-emitting device using a Group III nitride based compound semiconductor, electrodes for the n-type gallium nitride based compound semiconductor layer and the p-type gallium nitride based compound semiconductor layer, respectively, are formed on same side of a plane because such light-emitting device comprises an insulation substrate. There are two types of flip-chip type structure and wire-bonding type structure in which lights are outputted from the semiconductor layer side through the transparent electrode, in such a light-emitting device. Compared with a wire-bonding type light-emitting device, absorption of light in a light-transmitting electrode and screening of light by a thick-film pad electrode which is usually used in a wire-bonding device and is formed on the light-transmitting electrode hardly occur in a flip-chip type light-emitting device. That enables a flip-chip type device to output light generated in the active layer efficiently.

Conventionally, as shown in Japanese Patent Application Laid-open No. 2000-36619, a flip-chip type light-emitting semiconductor device using double-hetero junction structure of a Group III nitride based compound semiconductor is known. The conventional light-emitting device comprises a sapphire substrate as a light-transmitting substrate and an electrode layer made of rhodium (Rh) as a reflection layer and an electric current supplying layer formed on the uppermost p-type contact layer. Some of lights which is emitted from the emission layer directs to the opposite side of the substrate and is reflected by the electrode layer toward the substrate side to thereby outputting lights effectively. Rhodium has comparatively high reflectivity of 60% toward blue-color light. On the contrary, silver, aluminum, or a silver alloy has reflectivity of more than 60%, and they are useful for forming the reflection layer. However, silver and aluminum tarnish and deteriorate by carrying out heat treatment to the p-type contact layer such as alloying, which results in decreasing reflectivity. Especially, when silver is used to form the reflection layer, the Ag reflection layer may easily be exfoliated from the p-type contact layer. And because ion migration and electro migration in silver are large, problems may be left both in electricity and reliability.

As shown in Japanese Patent Application Laid-open No. 10-4208, a GaAl semiconductor also has similar problems. In order to solve such problems, a transparent indium tin oxide (ITO) is formed on the contact layer and Au or Au/Cu reflection layer is deposited thereon so that the metal can be kept from reacting directly with the semiconductor layer.

Japanese Utility Model Registered No. 3068914 discloses to form an ITO film on a GaN based semiconductor layer and then form a reflection layer made of silver or aluminum in order to improve external quantum efficiency of a flip-chip type light-emitting device.

Japanese Patent Application Laid-open No. H6-232450 discloses to deposit an electrode made of gold (Au)/nickel (Ni) having a width of 20 μm or less on a gallium nitride based compound semiconductor doped with p-type dopant, to carry out annealing treatment, and to deposit a conductive material such as Au, indium (In), and aluminum (Al) thereon.

Japanese Patent Application Laid-open No. 2001-217461 discloses a flip-chip type gallium nitride compound semiconductor light-emitting device comprising an electrode, in which a contact layer made of a metal material which can ohmic contact to the gallium nitride based compound semiconductor layer, a reflection layer made of Ag having high reflectivity, and a protection film made of Ni are deposited in sequence, formed on the p-type gallium nitride based compound semiconductor layer. Here, Ni, Co, and antimony (Sb) are disclosed as a metanl material having good ohmic contact characteristic.

Japanese Patent Application Laid-open No. 2003-224297 discloses a flip-chip type gallium nitride based compound semiconductor light-emitting device in which a light-transmitting ohmic electrode is formed on a p-type gallium nitride based compound semiconductor layer and a reflection layer covers the light-transmitting ohmic electrode through a light-transmitting insulation film. Here, Ni—Au, Ni—Pt, Co—Au are disclosed as materials to form the light-transmitting ohmic electrode, $SiO_2$, $Al_2O_3$, SiN, $TiO_2$, $ZrO_2$ are disclosed as materials to form the light-transmitting insulation film, and Al, Ag and Rh are disclosed as materials to form the reflection layer.

Japanese Patent Application Laid-open No. 2004-71655 discloses a flip-chip type gallium nitride compound semiconductor light-emitting device in which an electrode is formed on the p-type gallium nitride based compound semiconductor layer. The electrode comprises a first member which has an opening part at the center and is made of a material selected from Ni, Au, Rh, Ir and Pd having low contact resistivity, and a second member which is formed on the first electrode member and is mainly made of Ag which fills the opening part of the electrode member.

DISCLOSURE OF THE INVENTION

Problems to be Solved

When a reflection layer made of silver or aluminum is formed on the ITO film, however, the inventors of the invention found that interface reaction discolors and deteriorates each of ITO, silver, and aluminum, quantity of light incided toward the metal reflection layer decreases, and quantity of light reflected to the substrate side and outputted to the outside decreases.

Generally, because of a Schottky barrier existing at the interface between the compound semiconductor and the metal, the compound semiconductor comprising a gallium nitride based compound semiconductor layer can hardly obtain ohmic characteristic only by depositing a metal electrode on a semiconductor layer. In order to remove the barrier, it is necessary to carry out heat treatment, i.e., "sintering," "annealing," and "alloying." As a metal material which enables to obtain excellent ohmic characteristic toward the p-type gallium nitride based compound semiconductor layer, a material having larger work function such as Au, Ni and Ag are well known. On the contrary, because a flip-chip type light-emitting device reflects light generated in the active layer by the electrode to output the light, the electrode needs to have excellent ohmic characteristic and higher reflectivity with respect to wavelength of the light generated in the active layer.

The following table shows reflectivity (%) of each kind of metal film with respect to 4 wavelength regions.

| wavelength (nm) | Ag | Al | Au | Cu | Ni | Pt | Rh |
|---|---|---|---|---|---|---|---|
| ultra violet region (280) | 25.2 | 92.3 | 37.8 | 33 | 37.6 | 43.1 | 68.5 |
| violet color (400) | 94.8 | 92.4 | 38.7 | 47.5 | 41.2 | 52.4 | 77.6 |
| red color (700) | 98.5 | 89.9 | 97.0 | 97.5 | 68.8 | 69.0 | 80.4 |
| infrared region (1000) | 98.9 | 93.9 | 98.2 | 98.5 | 72.0 | 77.0 | 85.0 |

Because luminescent color of a gallium nitride based compound semiconductor ($Al_xGa_yIn_{1-x-y}N$ ($0 \leq x \leq 1$, $0 \leq y \leq 1$, $0 \leq x+y \leq 1$)) covers from ultraviolet region to orange color region, Al and Ag are suitable according to the table from the viewpoint of reflectivity. However, Al cannot have excellent ohmic characteristic toward a p-type gallium nitride compound semiconductor and Ag atoms have remarkable electro migration and ion migration. So that leaves problems to be solved in electricity and reliability.

Also, conductive materials such as Au, indium (In), and Al formed on Au/Ni electrode disclosed in Japanese Patent Application Laid-open No. H6-232450 have following problems. That is, optical reflectivity of Au/Ni is too small. Al, which is one of the materials Au, In and Al formed on the Au/Ni electrode, has larger reflectivity, but it may contact with a gallium nitride based compound semiconductor to be an AlN at the interface. That is, Al tends to be changed from Al/GaN to GaN/AlN/Ga. That leaves problems in electricity and reliability.

In Japanese Patent Application Laid-open No. 2000-36619, the electrode deposited on the p-type gallium nitride based compound semiconductor layer is made of a thick-film silver (Ag), rhodium (Rh), ruthenium (Ru), platinum (Pt), and palladium (Pd), and cobalt (Co) and Ni are used between the p-type gallium nitride based compound semiconductor layer and the thick-film electrode. However, problems as described above persist when the electrode is made of Ag. Even when the electrode is made of the other materials, each reflectivity of Rh, Ru, Pt, and Pd is not sufficiently large. Further, Co and Ni existing at the interface between p-type gallium nitride based compound semiconductor layer and the thick-film electrode may absorb lights.

Similar problems persist in the structures disclosed in Japanese Patent Application Laid-open No. 2001-217461 and No. 2003-224297. Further, the electrode disclosed in Japanese Patent Application Laid-open No. 2004-71655 has structure which necessarily results in increasing driving voltage owing to alloying of Rh and Ag and generating migration of Ag atoms. Accordingly, there remain problems in electricity and reliability.

The present invention has been accomplished in an attempt to solve the aforementioned problems, and an object of the present invention is to form an insulation protection film between a metal reflection layer and a transparent conductive film to suppress interface reaction between the metal reflection layer and the transparent conductive film and improve reflectivity of the metal reflection layer, resulting in improving external quantum efficiency of the light-emitting semiconductor device.

Other object of the present invention is to provide a light-emitting semiconductor device having flip-chip structure in which materials and structure of the electrode is comprehensively excellent in electricity, optics, and reliability.

Means to Solve the Problems

In order to overcome the above-described drawbacks, the followings may be useful.

That is, an aspect of the present invention is a flip-chip type light-emitting semiconductor device which comprises a light-transmitting substrate, a semiconductor layer deposited on the light-transmitting substrate, and an n-electrode and a p-electrode formed at the semiconductor layer side against the light-transmitting substrate, and which radiates light from the light-transmitting substrate side, comprising: a contact layer which is the uppermost layer of in the semiconductor layer; a first electrode layer which is formed on the contact layer and supplies electric current to the contact layer; an insulation protection film which is formed on the first electrode layer and transmits lights; a reflection film which is formed on the insulation protection film, made of metal and has high reflectivity to light; and a second electrode layer which is formed on the reflection film and contacts to at least a portion of the first electrode layer.

Other aspect of the present invention is that the first electrode layer comprises a transparent conductive film which is transparent to lights.

Here, the light-emitting device is a flip-chip type light-emitting semiconductor device employed as a face-down device whose semiconductor layer is connected to a lead frame with its substrate upside. The semiconductor material may be arbitral, but the present invention is especially useful for a light-emitting device using a Group III nitride based compound semiconductor. The contact layer on which the transparent conductive film is formed may be made of a p-type semiconductor or an n-type semiconductor. The uppermost layer which is the farthest layer from the light-transmitting substrate is generally a p-type semiconductor owing to activation process of p-type conduction of a Group III nitride based compound semiconductor, but development in manufacturing technology may enable to form the uppermost layer with an n-type semiconductor. Accordingly, the contact layer on which the transparent conductive film is formed may have any conduction type in the present invention.

The light-transmitting substrate may be made of any material if it has high transparency to the lights emitted by the emission layer. For example, sapphire ($Al_2O_3$), silicon carbide (SiC), gallium nitride (GaN), gallium phosophide (GaP), zinc oxide (ZnO), magnesium oxide (MgO), manganese oxide (MnO), or a quaternary, ternary, or binary semiconductor represented by a formula $Al_xGa_yIn_{1-x-y}N$ may be applied to form the light-transmitting substrate. In short, any material will do if it has high transparency to emitted lights.

The transparent conductive film may be made of a metal oxide, and indium tin oxide (ITO) and zinc oxide (ZnO) may be applied as typical examples.

The insulation protection film may be made of a metal oxide, a metal nitride, or a glass. As typical example, silicon oxide (SiO, $SiO_2$, $Si_xO_y$, etc.), silicon nitride (SiN, $Si_2N_3$, $Si_xN_y$, etc.), titanium oxide (TiO, $TiO_2$, $Ti_xO_y$, etc.), titanium nitride (TiN, $TiN_2$, $Ti_xN_y$, etc.), and a composition comprising any of these materials, and a multiple layers made of those materials can be used.

The reflection film may be made of an arbitral metal if it has high reflectivity with respect to emitted lights. Preferably, the reflection film may be made of at least one of silver (Ag), aluminum (Al), silver alloy, aluminum alloy, and an alloy mainly comprising silver and aluminum.

The second electrode may be made of an arbitrary material, and gold, a multiple film comprising gold and titanium, or an alloy of gold and titanium may be employed.

Further alternatively, the gallium nitride based compound semiconductor can emit light from deep bandgap which has wavelength of 280 nm in ultraviolet region. At that time, the reflection film made of Al can be applicable to the device.

Another aspect of the present invention is that the transparent conductive film has an exposed portion on which the insulation protection film is not formed at least a portion around a periphery part of the transparent conductive film and that a portion of the second electrode layer is formed on the exposed portion.

The exposed portion is formed owing to the relation of the transparent conductive film and the insulation protection film. The exposed portion may be formed all around the periphery of the transparent conductive film, at a portion of the periphery, or at plural portions of the periphery of the transparent conductive film. The electrode layer contacts to the exposed portion and the electrode layer electrically contacts to the transparent conductive film at this exposed portion. As a result, electric current is supplied from the exposed portion.

Another aspect of the present invention is that the portion around the reflection film is covered by the insulation protection film.

By forming the reflection film in the insulation protection film, each reaction at the interface between the reflection film and the transparent conductive film and the interface between the reflection film and the electrode layer can be completely suppressed. And when electromigration is large as in the case that the reflection film is made of silver, electromigration can be completely suppressed and reflectivity can be prevented from decreasing.

Another aspect of the present invention is a flip-chip type light-emitting semiconductor device which comprises a light-transmitting substrate, a semiconductor layer deposited on the light-transmitting substrate, and an n-electrode and a p-electrode formed at the semiconductor layer side against the light-transmitting substrate, and which radiates light from the light-transmitting substrate side, comprising: a contact layer which is the uppermost layer of in the semiconductor layer; a first electrode layer which is formed on the contact layer and supplies electric current to the contact layer; an insulation protection film which is formed on the first electrode layer and transmits lights; a reflection film which is formed on the insulation protection film, made of metal and has high reflectivity to light; and a second electrode layer which is formed on the reflection film and contacts to at least a portion of the first electrode layer, wherein the first electrode layer is formed to expose a portion of the contact layer.

Another aspect of the present invention is that the reflection film has larger reflectivity with respect to wavelength of light than the first electrode layer.

By employing these electrode materials and electrode structure, the first electrode layer can electrically obtain excellent ohmic characteristic between the semiconductor layer, and its driving voltage can be decreased. Because the first electrode layer is formed so as to expose a portion of the contact layer, area ratio of the first electrode layer, which has comparatively lower reflectivity, against the contact layer becomes smaller. That enables to pass light emitted from the active layer through the exposed portion of the contact layer, reflect the light effectively by the reflection film having high reflectivity, return the light to the semiconductor layer, and finally radiate to the outside of the device through the light-transmitting substrate. Further, this electrode has structure in which the light-transmitting insulation protection film prevents the reflection film having high reflectivity from contacting electrically to the first electrode layer and to the contact layer. As a result, driving voltage increase owing to alloying of metal atoms comprised in the reflection film and metal atoms comprised in the first electrode layer may not occur, and the interface between the semiconductor and the first electrode layer doest not change. Accordingly, materials and structure of the electrode is comprehensively excellent in electricity, optics, and reliability.

Here, the first electrode layer is formed to expose a portion of the contact layer in order that the area of the first electrode layer is as small as possible and that the light emitted by the active layer positively pass from the exposed portion. Area ratio of the exposed area of the contact layer on which the first electrode layer is not formed to the whole area of the contact layer may preferably be from 0.1 to 0.7. When the ratio is less than 0.1, the reflection film having high reflectivity has less effect. When the ratio is more than 0.7, sufficient ohmic characteristic cannot be obtained from the first electrode. The first electrode may or may not transmit the outputted light. In order to utilize light effectively, however, the first electrode may preferably transmit light because the light reflected by the reflection film can be used, and thickness of the first electrode may preferably from 1 nm to 10 nm. When thickness of the first electrode is less than 1 nm, ohmic characteristic can hardly be obtained. When thickness of the first electrode is more than 10 nm, too much light is absorbed by the first electrode.

If ohmic characteristic can be obtained, the first electrode layer may preferably be made of a metal having high reflectivity. Preferably, the first electrode layer may be made of, for example, Rh having reflectivity which is not so high as that of the metal used to form the reflection film but is comparatively high. Then thickness of the first electrode layer may preferably 10 nm or more.

Moreover, because the reflection film is formed on the insulation protection film, the reflection film is not connected to the first electrode layer electrically. That means electric current does not flow into the reflection film. In the present invention, electric current flows from the second electrode layer to the first electrode layer, but does not flow into the reflection film. Accordingly, even when the reflection film is made of Ag, electro migration and ion migration of Ag atoms hardly occur in the reflection film.

Another aspect of the present invention is that the second electrode layer is insulated from the reflection film and is electrically connected to the first electrode layer.

In the present invention, the reflection film insulates from both the first electrode and the second electrode. That enables to apply the light-emitting semiconductor device to a lead frame and a base material, and also enables to manufacture an LED lump which is excellent in electricity, optics, and reliability.

Another aspect of the present invention is that the insulation protection film comprises at least one layer or multiple layers selected from $SiO_2$, $Al_2O_3$, SiN, $TiO_2$, $ZrO_2$, and SOG. That enables to conduct the whole light emitted from the active layer to the reflection film having high reflectivity without deteriorating it.

Another aspect of the present invention is that the second electrode layer is made of a metal which does not include metal comprised in the reflection film. That enables to apply the light-emitting semiconductor device to a lead frame and a base material, and also enables to manufacture an LED lump which is excellent in electricity, optics, and reliability. When the light-emitting semiconductor device is applied to a lead frame and a base material, a bump and a solder mainly comprising Au may be used. At that time, Ti, Ni, and Au may preferably be used as main components to form the second electrode layer.

Another aspect of the present invention is that the contact layer is a p-type gallium nitride compound semiconductor and that the first electrode layer comprises at least one metal selected from Rh, Pt, Pd, Ir, and Ru. By using those metals, especially the p-type gallium nitride compound semiconductor can obtain excellent ohmic characteristic easily. Here, the gallium nitride based compound semiconductor may be represented by the formula $Al_xGa_yIn_{1-x-y}N$ ($0 \leq x \leq 1$, $0 \leq y \leq 1$, $0 \leq x+y \leq 1$), and includes not only GaN but also a binary compound such as AlN and InN, a ternary compound such as AlGaN, GaInN, and AlInN, and a quaternary compound such as AlGaInN.

Another aspect of the present invention is that the first electrode layer is formed in at least one kind or a combination of a grid-like pattern, an island-like pattern (dot-like pattern), and a strip-like pattern.

Effects of the Present Invention

Effects to be obtained by the present invention are explained as follows.

The insulation protection film suppresses interface reaction of the reflection film and the transparent conductive film. As a result, a driving voltage can be prevented from increasing. When the first electrode layer is a transparent conductive film, both transparency of the transparent conductive film and reflectivity of the reflection film can be prevented from decreasing. Then luminous output efficiency of lights outputted through the light-transmitting substrate can be improved.

When electricity is conducted, electric current flows into the transparent conductive film only from the contact part of the electrode layer and the transparent conductive film owing to the insulation protection film. That enables to remarkably decrease possibility of generating electromigration of the reflection film. When the entire surface of the reflection film is covered by the insulation protection film, electromigration of the reflection film can be prevented from generating more certainly.

In the present invention, the materials of the first electrode layer can be different from that of the reflection film. So the metal used to form the first electrode layer can be replaced with a material which has excellent ohmic contact to the contact layer, and that enables to reduce driving voltage of the light-emitting device.

According to another aspect of the present invention, the first electrode layer is formed to expose a portion of the contact layer. That enables to pass light emitted from the active layer through the exposed portion of the contact layer, reflect the light effectively by the reflection film having high reflectivity, return the light to the semiconductor layer, and finally radiate to the outside of the device through the light-transmitting substrate. Further, this electrode has structure in which the light-transmitting insulation protection film prevents the reflection film having high reflectivity from contacting electrically to the first electrode layer and to the contact layer. As a result, driving voltage increase owing to alloying of metal atoms comprised in the reflection film and metal atoms comprised in the first electrode layer may not occur, and the interface between the semiconductor and the first electrode layer doest not change. Accordingly, materials and structure of the electrode is comprehensively excellent in electricity, optics, and reliability.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which:

FIG. 17 is a table showing comparison between the light-emitting device of the comparative example and the light-emitting devices of the third embodiment and the fourth embodiment of the present invention.

BEST MODE FOR CARRYING OUT THE INVENTION

Embodiments of the present invention will next be described based on concrete examples. The scope of the present invention, however, is not limited to the embodiment described below.

Figure 1:
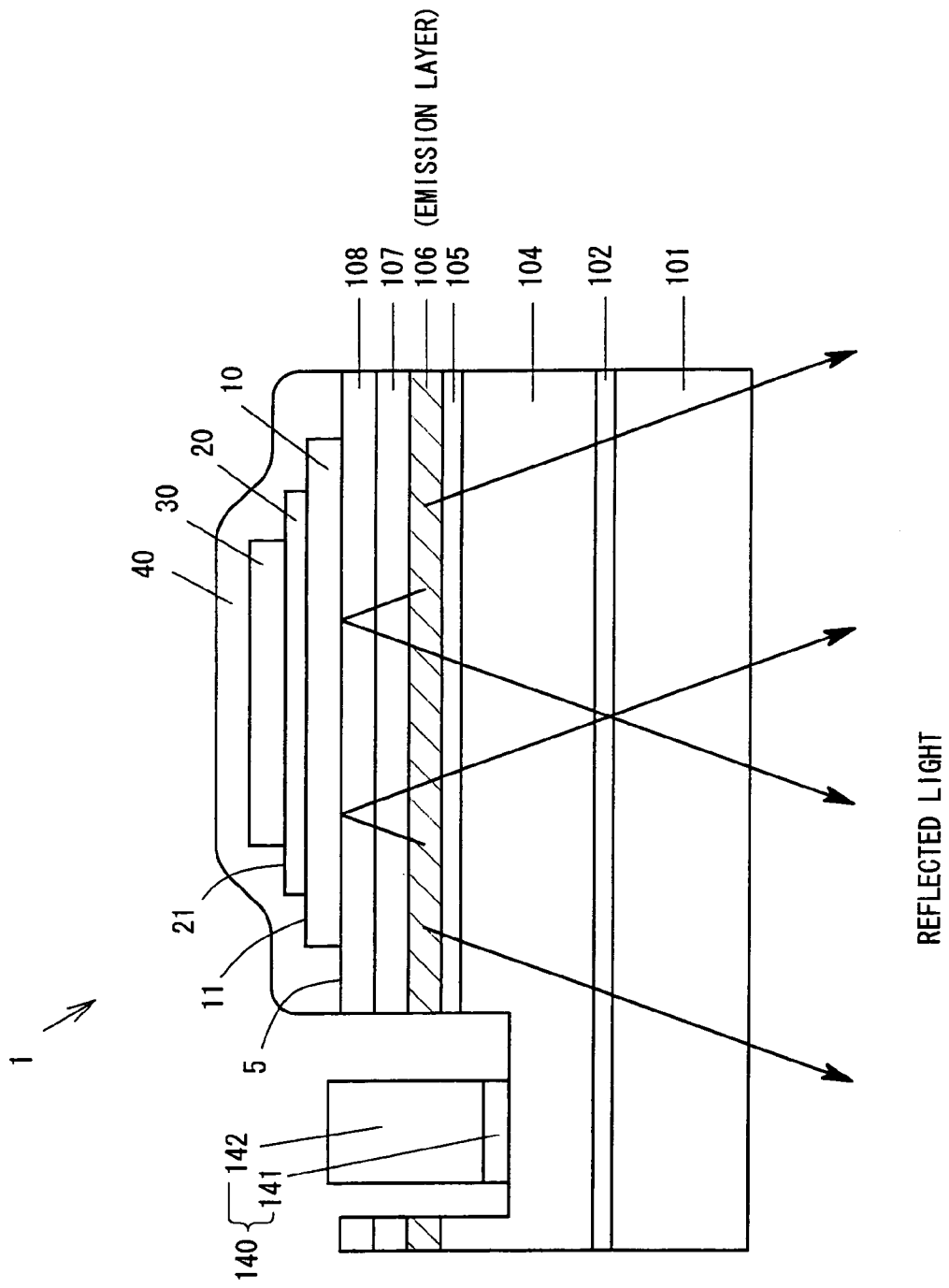
FIG. 1 is a sectional view of a light-emitting device according to the first embodiment of the present invention.

The present invention is about a flip-chip type of light-emitting semiconductor device 1 shown in FIG. 1. Structure of layers in the light-emitting semiconductor device in the present invention is explained later. Lights are outputted from a transparent or a light-transmitting substrate 101 side. On the light-transmitting substrate 101, layers each made of a Group III nitride compound semiconductor are deposited, and the uppermost layer of the semiconductor layers is a contact layer 108. A transparent conductive film 10, an insulation protection film 20, a reflection film 30, and an electrode layer 40 are deposited on the contact layer 108 in sequence.

The contact layer 108 has a ring-shaped first exposed portion 5 around its peripheral region on which the transparent conductive film 10 is not formed. The transparent conductive film 10 has a ring-shaped second exposed portion 11 around its peripheral region on which the insulation protection film 20 is not formed, and the insulation protection film 20 has a ring-shaped third exposed portion 21 around its peripheral region on which the reflection film 30 is not formed. The electrode layer 40 is formed so that it contacts to each of the third exposed portion 21 formed at the insulation protection film 20, the second exposed portion 11 formed at the transparent conductive film 10, and the first exposed portion 5 formed at the contact layer 108. As shown in the plain view of FIG. 2 viewed from the direction vertical to the emission plane, each of the first exposed portion 5, the second exposed portion 11, and the third exposed portion 21 are formed in a graded ring shape in the peripheral region of the contact layer 108. The electrode layer 40 is formed at the hatched region in FIG. 2.

Accordingly, the insulation protection film 20 existing between the reflection film 30 and the transparent conductive film 10 prevents interface reaction of the reflection film 30 and the transparent conductive film 10. Because of that, transparency of the transparent conductive film 10 never decreases and reflectivity of the reflection layer never decreases. Quantity of light injected into the reflection film 30 does not decrease and reflectivity of the reflection film 30 does not decrease. As a result, quantity of light reflected to the light-transmitting substrate 101 side can be increased.

Further, when electric voltage is applied to the electrode layer 40 so that the electrode layer 40 has positive electric potential, electric current flowing from the reflection layer 30 in vertical direction toward the substrate 101 is prevented by the insulation protection film 20. Most of the electric current flows from the peripheral region of the electrode layer 40 through the ring-shaped second exposed portion 11 and is supplied to the transparent conductive film 10. And another portion of the electric current flows from the peripheral region of the electrode layer 40 through the sidewalls of the transparent conductive film 10 to the transparent conductive film 10. And also the other portion of the electric current flows to the contact layer 108 through the ring-shaped first exposed portion 5. As a result, electric current never flows in vertical direction to the surface of the reflection film 30, and electromigration of metal atoms in the reflection film 30 is never generated.

When the same amount of electric current is supplied to the contact layer 108, the transparent conductive film 10 and the reflection film 30 may have as large area as possible so as to improve external quantum efficiency. Because luminous intensity is larger in a region near to the other electrode 140, the first exposed portion 5 and the second exposed portion 11 may not be formed at the region. Considering those conditions, the structure shown in FIG. 3 may be preferable. That is, the transparent conductive film 10 is formed in the same shape as the contact layer 108, but does not have the first exposed portion 5. The insulation protection film 20 is formed at the upper portion of the transparent conductive film 10 and at the inner side of the right side A and the lower side B in FIG. 3, to thereby form the second exposed portion 11 in L-shape. The reflection film 30 is formed in the same shape as the insulation protection film 20, and the third exposed portion 21 is not formed. Then the electrode layer 40 is formed in the same plane shape as the contact layer 108. The electrode layer 40 contacts to the transparent conductive film 10 at the L-shape second exposed portion 11 placed at the right edge A and the bottom edge B in FIG. 3. Electric current is supplied from the second exposed portion 11 to the transparent conductive film 10, spreads in the lateral direction in the transparent conductive film 10, and then flows in vertical direction to the contact layer 108 which is placed at the lower side of the wafer. By forming the transparent conductive film 10 to have larger area, the emission part can be larger. And by forming the reflection film 30 to have larger area, reflection area to the substrate 101 can be larger.

Figure 3:
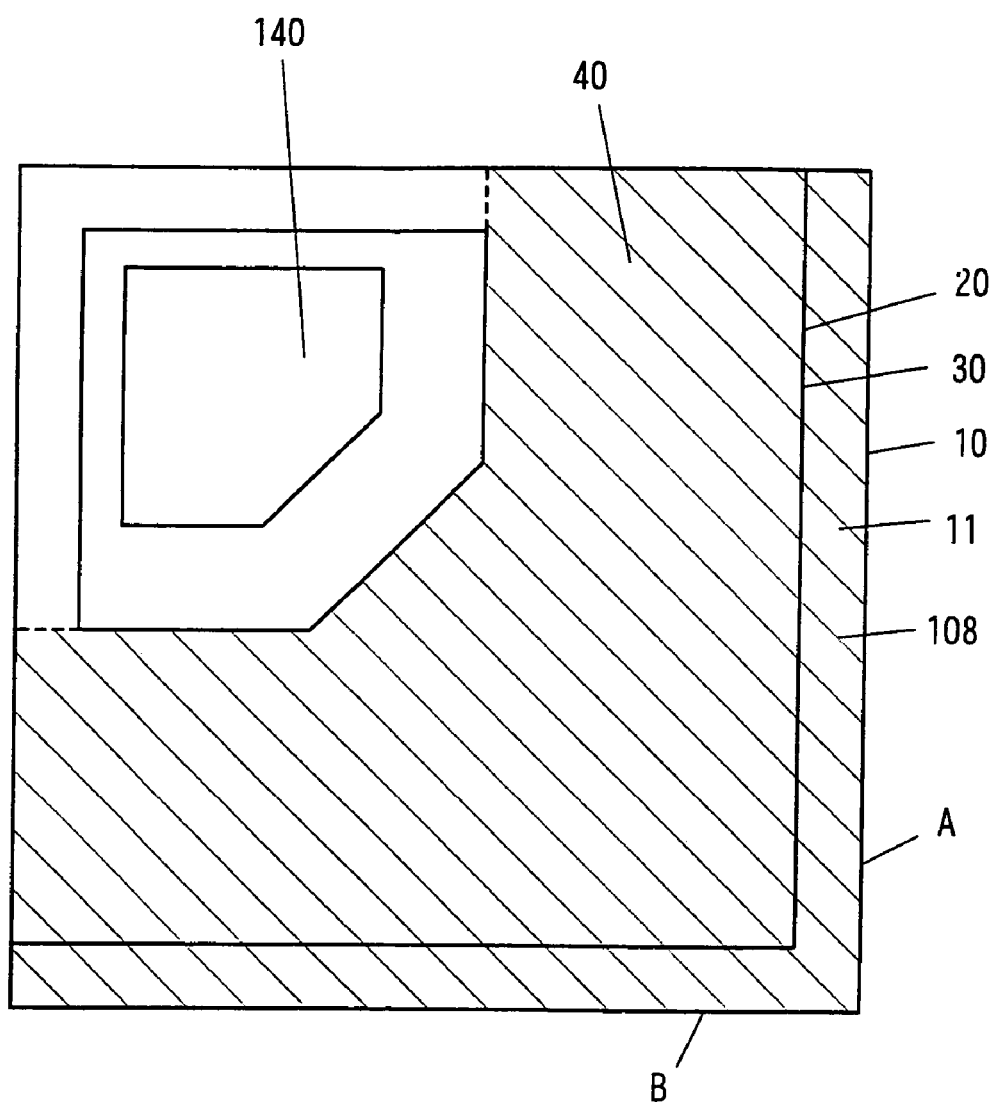
FIG. 3 is a plane view of the light-emitting device according to the second embodiment of the present invention.
Figure 4:
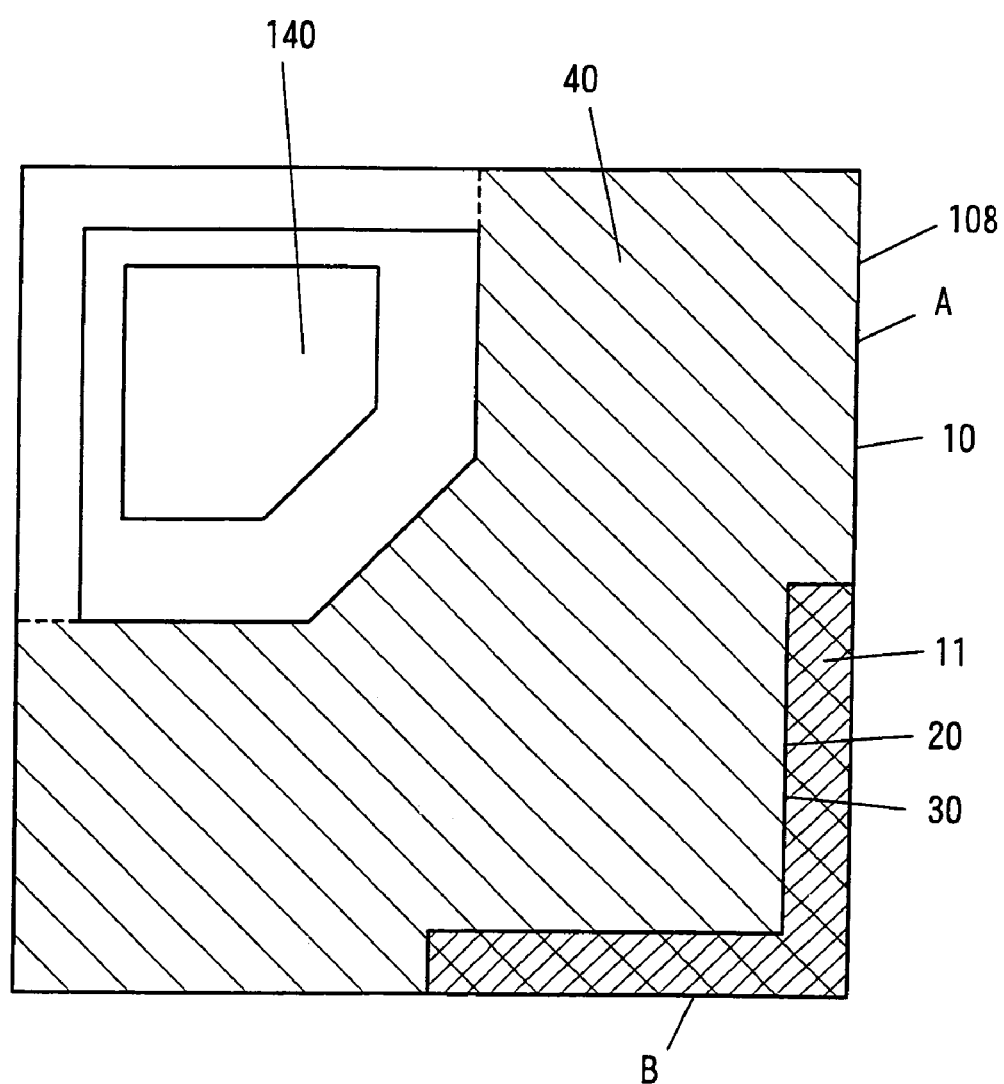
FIG. 4 is a plane view of the light-emitting device according to the second embodiment of the present invention.

The second exposed portion 11 may not be formed to each entire length of the right side A and the bottom side B as shown in FIG. 3. The second exposed portion 11 may be formed only ½ to ⅓ length of each edge from each corner as shown in FIG. 4. The transparent conductive film 10, the insulation protection film 20, and the reflection film 30 are formed at the portion on which the second exposed portion 11 is not formed. By employing such structure, electric current flows from the electrode layer 40 through the L-shape second exposed portion 11 and is sufficiently supplied to the transparent conductive film 10. That enables to use the other part except for the L-shape second exposed portion 11 as an emission region and a reflection region, and external quantum efficiency can be improved.

When the first exposed portion 5 and the second exposed portion 11 are not formed in a ring shape, they may be or may not be formed at the same position. When the second exposed portion 11 is not formed at all, electric current is supplied to the transparent conductive film 10 from its sidewalls and lights can be emitted. Because the second exposed portion 11, however, enlarges the area at which the electrode layer 40 contacts to the transparent conductive film 10, the second exposed portion 11 may preferably be formed. The first exposed portion 5 enables to supply electric current from the sidewalls of the transparent conductive film 10. So the first exposed portion 5 may preferably be formed on the same position as the second exposed portion 11.

Figure 5:
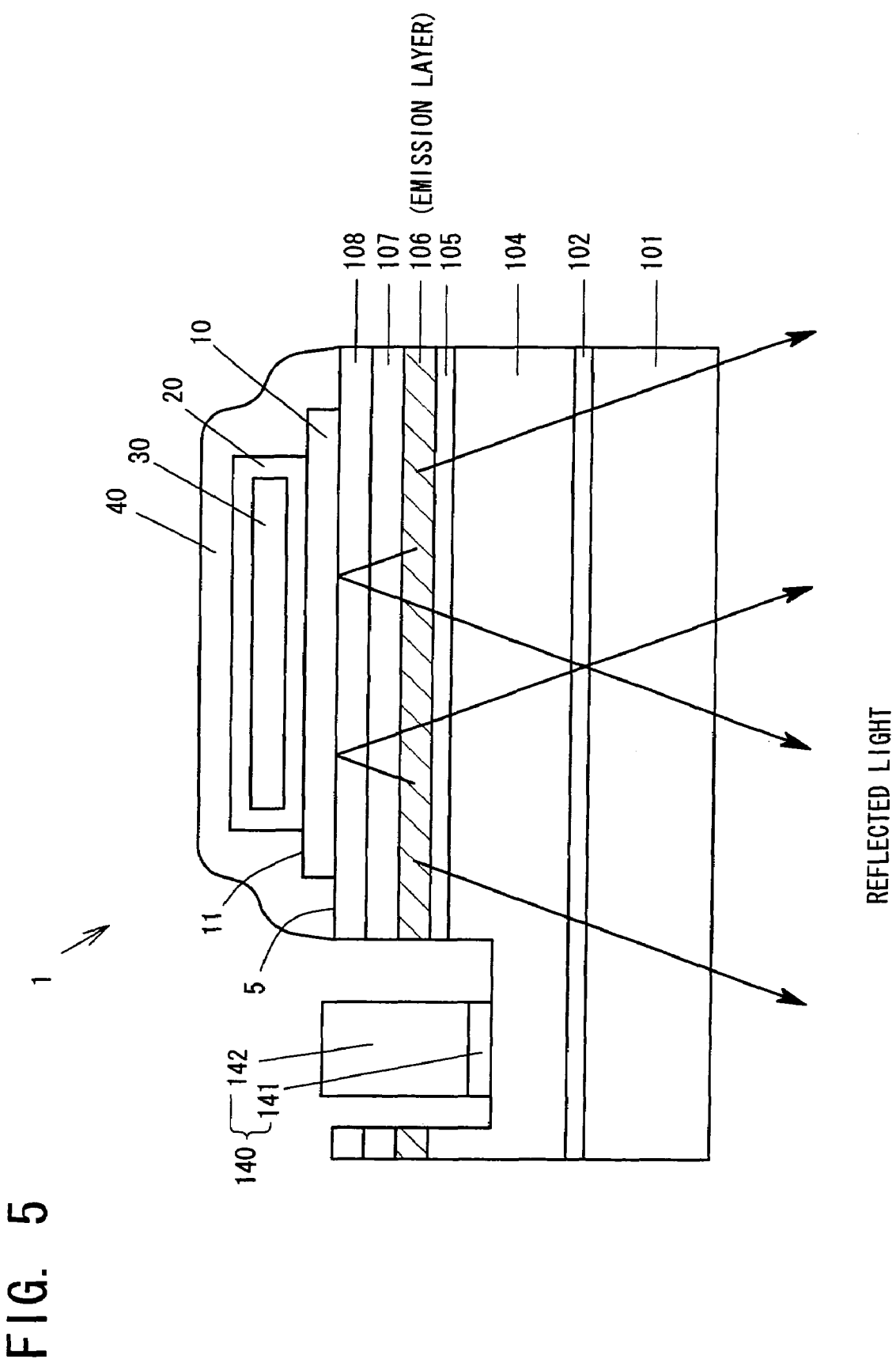
FIG. 5 is a plane view of the light-emitting device according to the second embodiment of the present invention.

Further, as shown in FIG. 5, the reflection film 30 may be completely covered by the insulation protection film 20 from both upside and downside, or the reflection film 30 may be formed inside of the insulation protection film 20. By forming the reflection film 30 in the insulation protection film 20, electromigration of metal atoms of the reflection film 30 can be prevented completely. As a result, reliability of the device can be improved.

The transparent conductive film 10 may be formed through sputtering, vacuum deposition, and so on. The transparent conductive film 10 may preferably be formed through vacuum deposition using electron beam, although it is not limited thereto. The insulation protection film 20 may be formed through sputtering, vacuum deposition, and so on. The insulation protection film 20 may preferably be formed through plasma CVD treatment, although it is not limited thereto. The reflection film 30 and the electrode layer 40 may preferably be formed through sputtering and vacuum deposition.

The emission layer may have single quantum-well structure or multiple quantum-well structure. Preferably, the structure may comprise a well layer which is made of a Group III nitride based compound semiconductor $Al_yGa_{1-y-z}In_zN$ ($0 \leq y<1$, $0<z \leq 1$) including at least indium (In). The emission layer comprises, for example, a doped or undoped $Ga_{1-z}In_zN$ ($0<z \leq 1$) well layer and a barrier layer which is made of a Group III nitride based compound semiconductor AlGaInN having arbitrary compositions and has larger band gap than the well layer. As a preferable example, the emission layer comprises an undoped $Ga_{1-z}$ $In_zN$ ($0<z \leq 1$) well layer and an undoped GaN barrier layer. Here, "dope" is to intentionally include a dopant in material gas and to dope it into the objected layer, and "undope" is not to include a dopant in material gas and not to dope a dopant intentionally into the layer. Accordingly, the undoped layer may also include when a dopant diffused from its adjacent layers is unintentionally doped into the undoped layer.

Molecular beam epitaxy (MBE), metal organic vapor phase epitaxy (MOVPE), Hydride vapor phase epitaxy (HVPE), and liquid phase epitaxy are useful for crystal growing a Group III-V nitride based compound semiconductor layer.

The Group III-V nitride based compound semiconductor comprised in each layer of the semiconductor device may be at least a binary, ternary, or quaternary Group III-V nitride based compound semiconductor satisfying the formula $Al_xGa_yIn_{1-x-y}N$ ($0 \leq x \leq 1$, $0 \leq y \leq 1$, $0 \leq x+y \leq 1$). Alternatively, a portion of the group III elements may be replaced with boron (B) or thallium (Tl), and a portion or all of nitrogen (N) may be replaced with phosphorous (P), arsenic (As), antimony (Sb), or bismuth (Bi).

Further, when the n-type layer is made of those semiconductor, Si, Ge, Se, Te, and C may be doped as an n-type impurity. When the p-type layer is made of those semiconductor, Be, Ca, Sr, and Ba may be doped as a p-type impurity.

Through employment of the aforementioned aspects of the present invention, the aforementioned drawbacks can be overcome effectively and rationally.

EMBODIMENT 1

Figure 2:
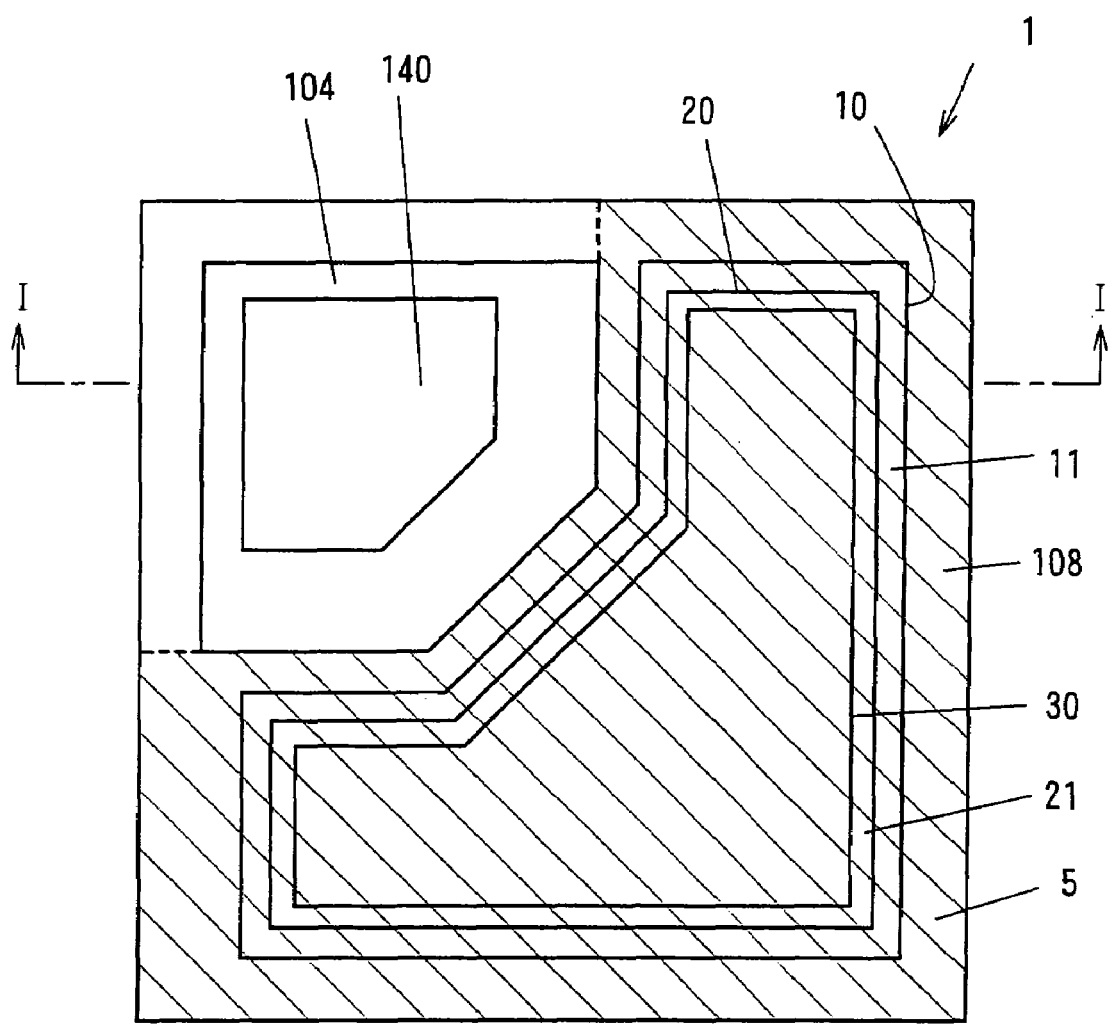
FIG. 2 is a plane view of the light-emitting device according to the first embodiment of the present invention.

FIG. 1 is a sectional view and FIG. 2 is a plane view of a light-emitting semiconductor device 1 in the present embodiment 1. About 20 nm in thickness of aluminum nitride (AlN) buffer layer 102 is formed on 100 μm in thickness of light-transmitting sapphire substrate 101. About 8.0 μm in thickness of silicon (Si) doped GaN high-carrier concentration n⁺-layer is formed thereon as an n-type contact layer 104. The n-type contact layer 104 has electron concentration of $5 \times 10^{18}/cm^3$. The higher the electric concentration of the n-type contact layer 104 is, the more preferable, and it is possible to increase the electric concentration to $2 \times 10^{19}/cm^3$. And 200 nm in thickness of $In_{0.03}Ga_{0.97}N$ strain relaxation layer 105 is formed on the n-type contact layer 104. An emission layer 106 having multiple quantum-well (MQW) structure which comprises 3 periods in total of about 20 nm in thickness of undoped GaN and about 3 nm in thickness of undoped $Ga_{0.8}In_{0.2}N$ is formed on the strain relaxation layer 105. About 60 nm in thickness of magnesium (Mg) doped $Al_{0.15}Ga_{0.85}N$ p-type layer 107 is formed as a clad layer on the emission layer 106. And about 130 nm in thickness of magnesium (Mg) doped GaN p-type contact layer 108 is formed on the p-type layer 107.

On the p-type contact layer 108, a transparent conductive film 10 comprising ITO is formed through vacuum deposition using electron beam. Alternatively, sputtering and vacuum deposition can be employed for forming ITO film. At the periphery plane part of the p-type contact layer 108, a first exposed portion 5 is formed in a ring shape. An insulation protection film 20 made of $SiO_2$ is formed on the transparent conductive film 10 so that a second exposed portion 11 is formed around the periphery part of the transparent conductive film 10. The second exposed portion 11 corresponds to an exposed portion in claim 1 of the present invention. A reflection film 30 made of silver (Ag) is formed on the insulation protection film 20 so that a third exposed portion 21 is formed at the periphery part of the insulation protection film 20 in a ring shape. And an electrode layer 40 made of gold (Au) is formed so that it completely covers the first exposed portion 5, the second exposed portion 11, the third exposed portion 21 and the reflection film 30. Each thickness of the transparent conductive film 10, the insulation protection film 20, the reflection film 30, and the electrode layer 40 is 0.5 µm, 200 nm, 0.5 µm, and 1.2 µm, respectively.

Thickness of the reflection film 30 is preferably in a range from 0.01 µm to 5 µm considering reflection of lights. More preferably, thickness of the reflection film 30 is from 0.02 µm to 2 µm, and most preferably from 0.05 µm to 1 µm. Thickness of the transparent conductive film 10 is preferably from 0.05 µm to 1 µm, more preferably from 0.2 µm to 0.5 µm considering electric contact with the p-type contact layer 108.

Alternatively, the electrode layer 40 may have two-layer structure comprising 0.01 µm in thickness of titanium (Ti) and 0.5 µm in thickness of gold (Au), or may comprise an alloy including those metals. Alternatively, an Au layer and a Ti layer are deposited in sequence and it may covered by a protection film made of silicon oxide except for a portion for forming a bump.

On the contrary, an n-electrode 140 is formed on the n-type contact layer 104 which is exposed by etching from the p-type contact layer 108 side. The n-electrode 140 has two-layer structure comprising about 18 nm in thickness of vanadium (V) layer 141 and about 1.8 µm in thickness of aluminum (Al) layer 142, which are deposited in sequence on the exposed portion of the n-type contact layer 104.

The electrode layer 40 is formed uniformly at about three quarters of the region of the surface of the p-type contact layer 108 as shown in FIG. 2. The exposed portion of the electrode layer 40 and the exposed portion of the n-electrode 140 are connected to the bump.

External quantum efficiency of the thus-obtained light-emitting device 1 is improved about 20% compared with that of a light-emitting device which has no insulation protection film but comprises a reflection film made of Ag and an electrode layer made of Au in sequence on a transparent conductive film. Moreover, external quantum efficiency of the light-emitting device 1 does not decrease after 1000 hours of aging.

EMBODIMENT 2

A light-emitting semiconductor device shown in FIGS. 3, 4, and 5 is manufactured as explained in the best mode for carrying out the present invention, respectively. The light-emitting semiconductor device has effect similar to the device manufactured in the first embodiment. Each member which is shown in FIGS. 3, 4, and 5 and has same number as members in FIGS. 1 and 2 corresponds to each component in the first embodiment and in the best mode for carrying out the present invention.

FIG. 3 illustrates a device which does not comprise the first exposed portion and the third exposed portion but comprises only the second exposed portion 11 in L-shape at the right side A and the bottom side B. The transparent conductive film 10 made of ITO is formed in the same plane form as the p-type contact layer 108, and the insulation protection film 20 made of $SiO_2$ is formed in the same plane form as the reflection film 30 made of Ag. And the electrode layer 40 made of Au is formed to contact to the entire surface of the reflection film 30 and the second exposed portion 11. Electric current flows from the electrode layer 40 through the second exposed portion 11 and the surface of the transparent conductive film 10 into the transparent conductive film 10. The second exposed portion 11 corresponds to an exposed portion in claim 1 of the present invention. An example illustrated in FIG. 4 has the same structure as shown in FIG. 3 except for that the second exposed portion 11 is formed in L-shape whose right side is about one third to a half of the right side A and whose bottom side is about one third to a half of the bottom side B. An example illustrated in FIG. 5 comprises layers each of which has the same plane shape as each layer of the first embodiment illustrated in FIGS. 1 and 2. The reflection film 30 made of Ag is completely covered by the insulation protection film 20 made of $SiO_2$.

Arbitrary material, which is described in the best mode for carrying out the invention, can be chosen and employed to form each film and each layer of the light-emitting devices in the first embodiment and the second embodiment.

EMBODIMENT 3

Next, Embodiment 3 of the present invention is explained as follows.

(Crystal Growth of a Gallium Nitride Compound semiconductor)

Figure 6:
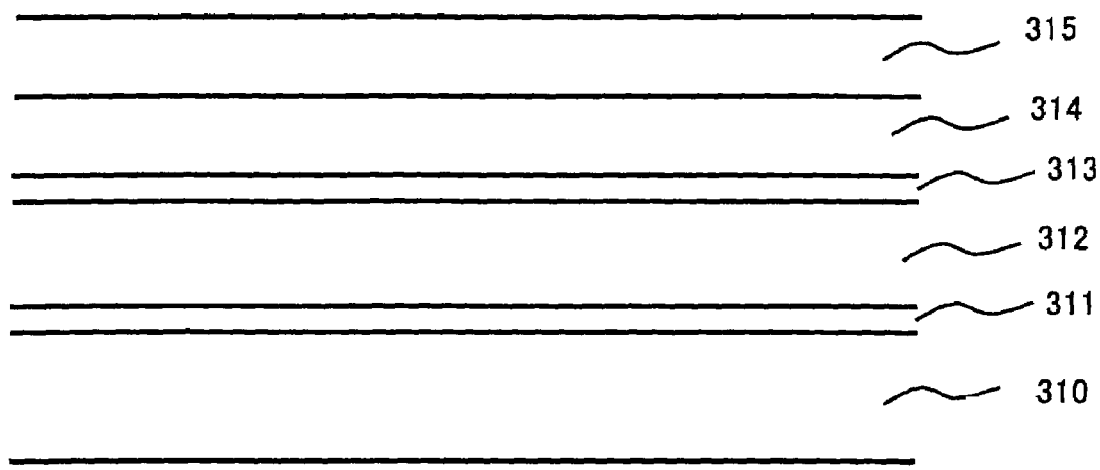
FIG. 6 is a sectional view of a gallium nitride compound semiconductor after crystal growth according to the third embodiment of the present invention.

As a substrate to grow a gallium nitride based compound semiconductor thereon, a sapphire substrate 310 is used. After carrying out washing and vapor phase etching treatment, about 20 nm in thickness of AlN low temperature deposition buffer layer 311, about 4 µm in thickness of Si-doped GaN n-type layer 312, an active layer 313 which has multiple quantum-well (MQW) structure and is made of GaN and GaInN, 60 nm in thickness of Mg-doped AlGaN p-type layer 314, and 150 nm in thickness of Mg-doped GaN p-type layer 315 are deposited on the sapphire substrate 310 in sequence through metal organic vapor phase epitaxy (MOVPE) (FIG. 6). Alternatively, in order to obtain 280 nm of luminous wavelength, a Si-doped AlGaN layer is used as the n-type layer 312 and the active layer 313 having multiple quantum-well (MQW) structure is formed by using AlGaInN.

(Etching for Forming an Electrode)

Figure 7:
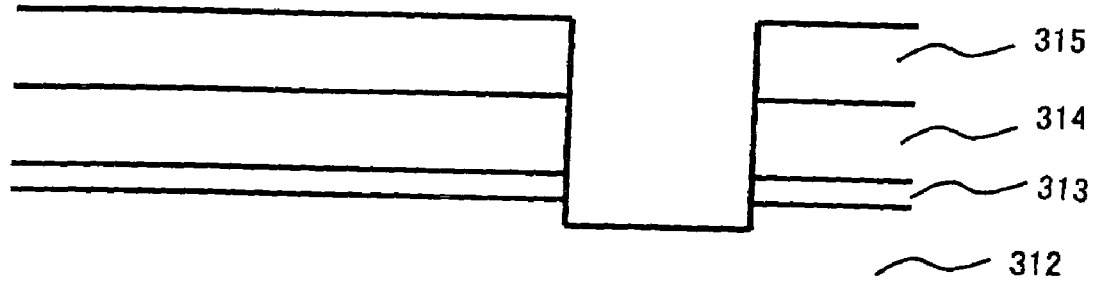
FIG. 7 is a sectional view of a light-emitting device after exposing an n-type layer according to a third embodiment of the present invention.

On the sample obtained through the above-described processes of each device, a mask is formed on a portion of the n-type layer 312 not to be exposed. The other portion of the n-type layer 312 on which the mask is not formed is removed through dry-etching to a certain depth, and then the mask is removed (FIG. 7).

(Forming the First Electrode Layer (Grid-like Pattern))

Figure 8:
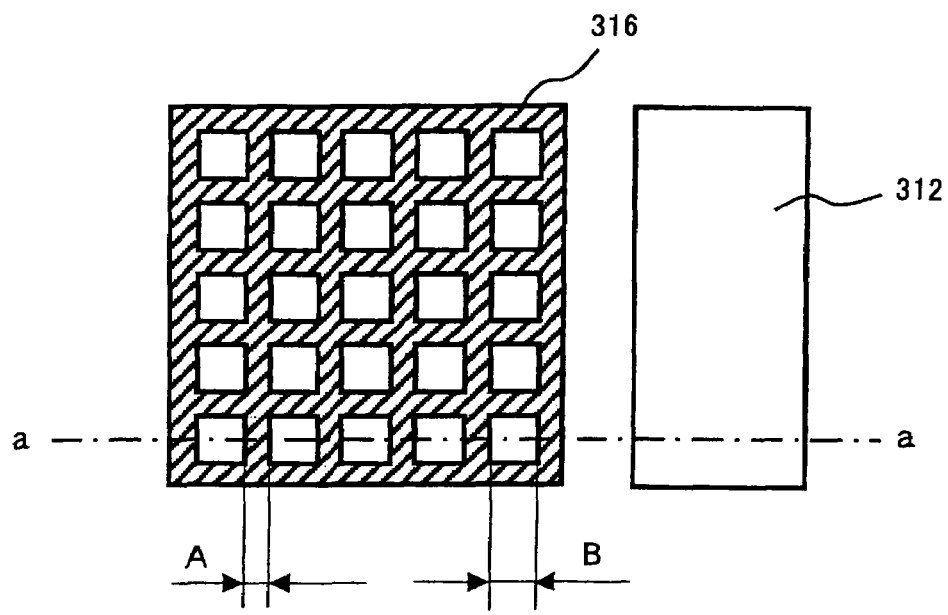
FIG. 8 is a plane view of the light-emitting device in which a first metal is formed on the p-type layer according to the third embodiment of the present invention.
Figure 9:
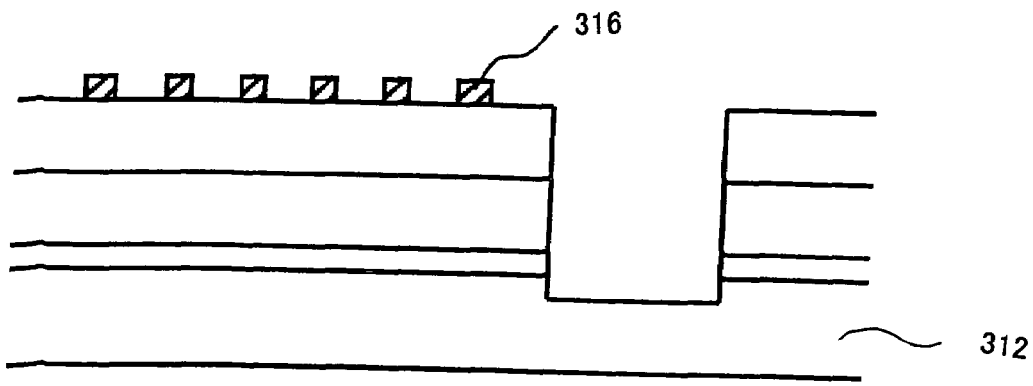
FIG. 9 is a sectional view of the gallium nitride compound semiconductor at the a-a line shown in FIG. 8.

Next, a mask is formed in grid-like pattern on a portion of the p-type layer 315 of each device on which the first electrode layer is not formed. About 400 nm in thickness of Rh first electrode layer 316, having a A part whose width is 2.0 µm and a B part whose interval is 4.0 µm, is formed through deposition treatment, and the mask is removed (FIGS. 8 and 9).

(Forming an Electrode on the N-type Layer)

Figure 10:
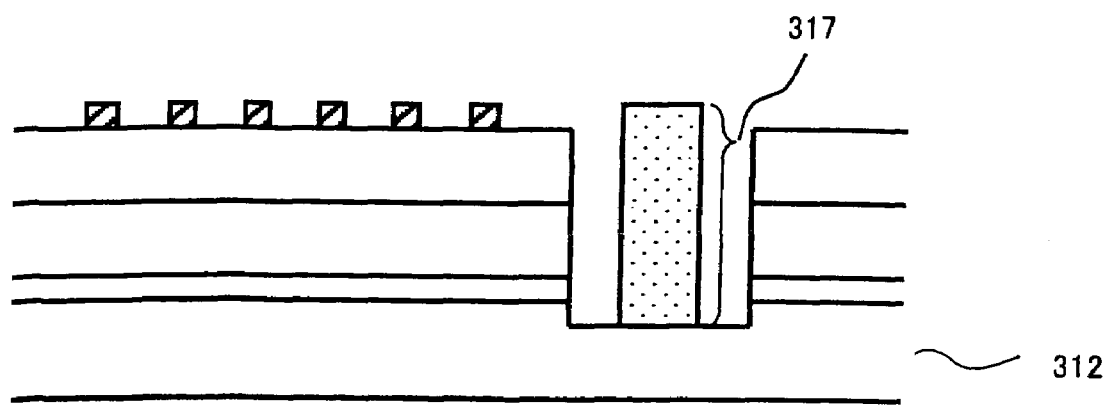
FIG. 10 is a sectional view of the light-emitting device in which an electrode is formed on the n-type layer according to the third embodiment of the present invention.

Next, a mask is formed on a portion of the n-type layer 312 of each device on which an electrode is not formed. About 20 nm in thickness of vanadium (V), about 100 nm in thickness of Al, and about 5 nm in thickness of Ti are deposited on the n-type layer 312 as the electrode 317 through deposition treatment, and then the mask is removed by a lift-off method (FIG. 10).

(Carrying out Heat Treatment)

Next, heat treatment is carried out in the atmosphere of oxygen at the temperature of about 600° C. for about 30 min. in order to remove a Schottky barrier existing at the interface between the first electrode layer 316 and the p-type layer 315, the electrode 317 and the n-type layer, respectively, thereby to obtain ohmic characteristic.

(Forming a Light-Transmitting Insulation Protection Film)

Figure 11:
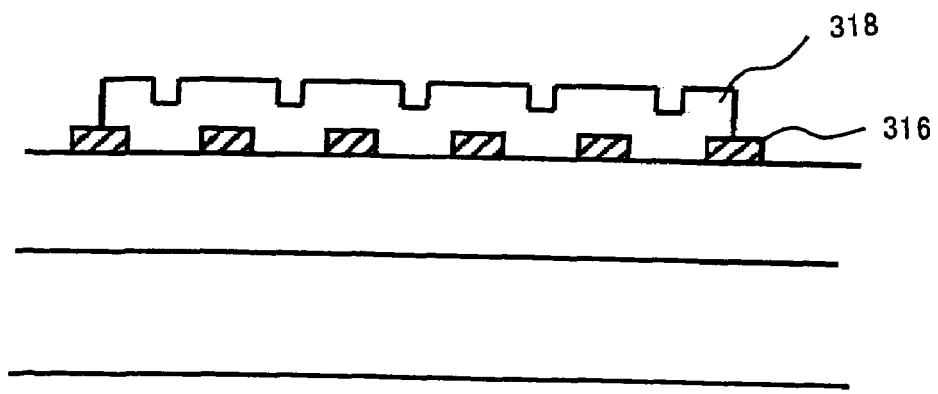
FIG. 11 is a sectional view of the light-emitting device after an insulation film is formed according to the third embodiment of the present invention.

Next, a mask is formed on a portion of the p-type layer 315 and the first electrode layer 316 of each device on which a light-transmitting insulation protection film is not formed. About 200 nm in thickness of $SiO_2$ is formed through CVD treatment as the light-transmitting insulation protection film 318, and then the mask is removed by a lift-off method (FIG. 11).

(Forming a Reflection Film)

Figure 12:
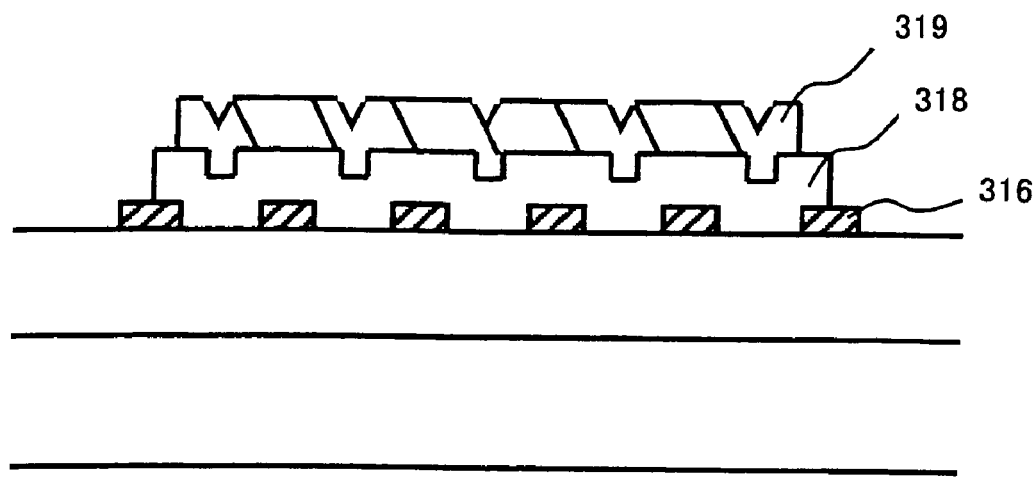
FIG. 12 is a sectional view of the light-emitting device after a reflection film is formed according to the third embodiment of the present invention.

Next, a mask is formed on a portion of the $SiO_2$ of each device on which a reflection film is not formed. About 300 nm in thickness of Al is formed through deposition treatment as the reflection film 319, and then the mask is removed by a lift-off method (FIG. 12). When luminous wavelength is more than 400 nm, the reflection film is formed by using Ag as described in the following comparative example (3).

(Forming a Second Electrode Layer)

Figure 13:
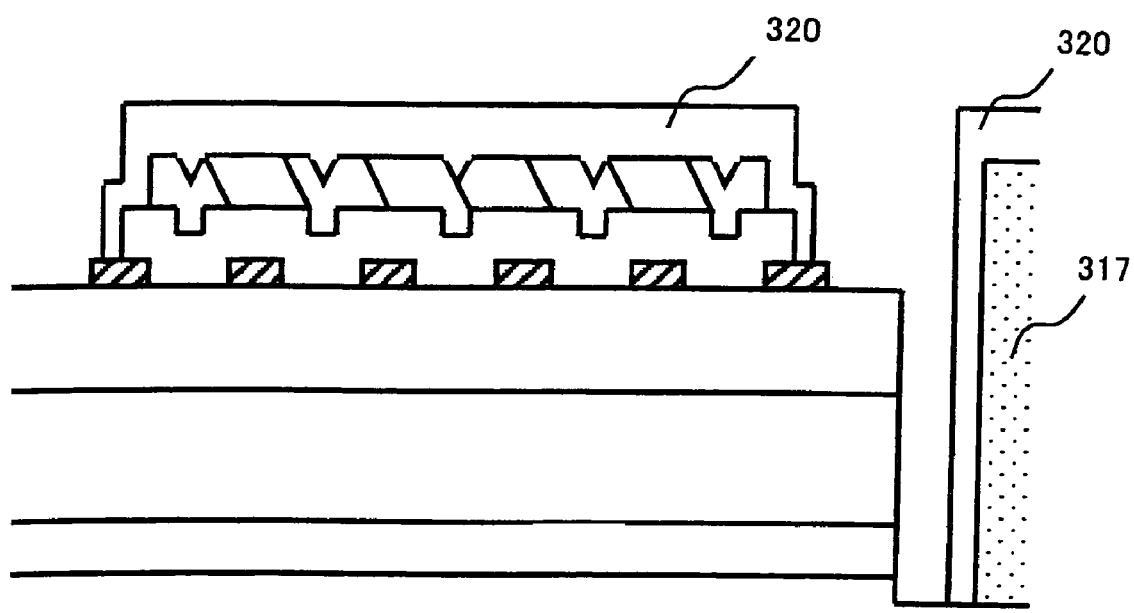
FIG. 13 is a sectional view of the light-emitting device after a second metal is formed according to the third embodiment of the present invention.

Next, a mask is formed on a portion of the electrode 317 to the n-type layer, the first electrode layer 316, the insulation protection film 318, and the reflection film 319 of each device on which a second electrode layer 320 is not formed. The second electrode layer 320 is made of Au. After forming about 600 nm in thickness of Au second electrode layer 320 is formed through deposition treatment, the mask is removed by a lift-off method (FIG. 13).

(Manufacturing an LED Lump)

Figure 14:
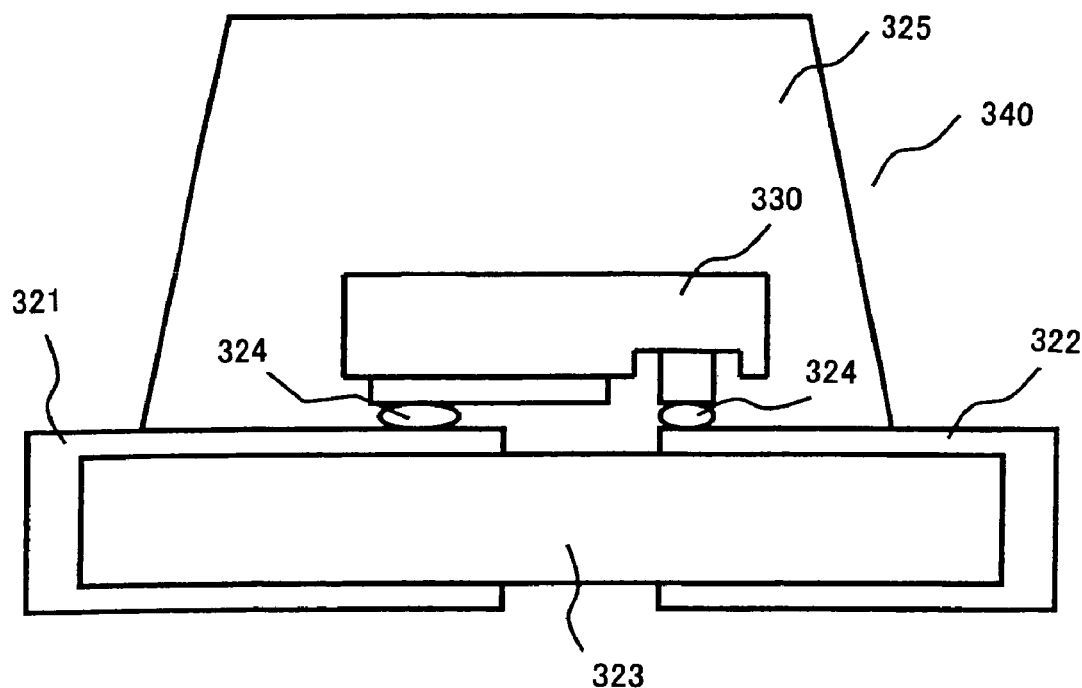
FIG. 14 is a sectional view of an LED lump in which a light-emitting semiconductor device is sealed with a sealing material according to a third embodiment of the present invention.

Next, the wafer is separated into each device by employing a normal scribing treatment, a light-emitting semiconductor device 330 is obtained. A base material 323 comprises a first electrode terminal 321 and a second electrode terminal 322 which are formed at a certain position of the surface and back surface of a synthetic resin plate by using conductive paste. The first electrode terminal 321 and the second electrode terminal 322 are electrically separated with each other and are formed on from the surface to the back surface of the synthetic resin plate. The light-emitting semiconductor device 330 is bonded to the base material 323 through a bump 324 made of Au by applying pressure. Then the periphery around the light-emitting semiconductor 330 is sealed by sealing material 325 which is made of a transparent epoxy resin, to thereby obtain an LED 340 (FIG. 14). When the LED 340 emits ultraviolet region light, silicon resin can be used as the sealing material 325 in place of epoxy resin.

EMBODIMENT 4

Figure 15:
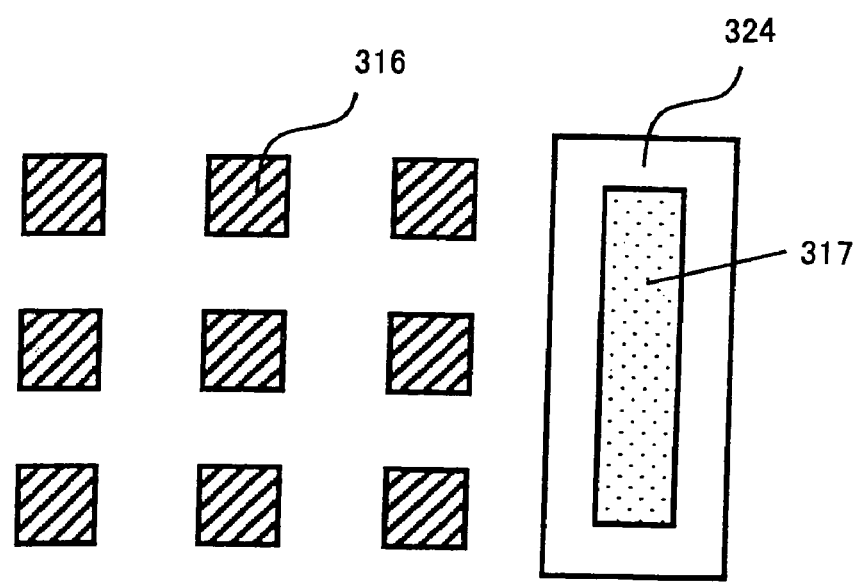
FIG. 15 is a plane view of the LED lump in which the first metal layer is formed in an island pattern (dot-like pattern) and an electrode is formed on the n-type layer according to the fourth embodiment of the present invention.
Figure 16:
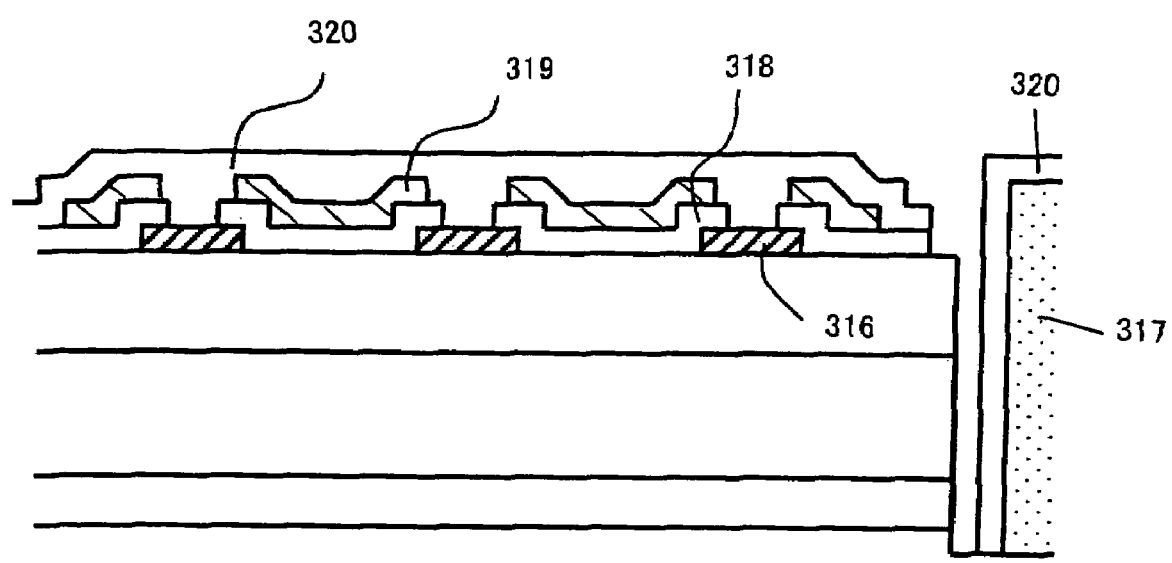
FIG. 16 is a sectional view of the LED lump in which the first metal layer is formed in an island pattern (dot-like pattern) and the second electrode layer is formed on the first metal layer according to the fourth embodiment of the present invention.

The first electrode layer 316 may be formed in an island-pattern (dot-pattern) (FIGS. 15 and 16). In the third embodiment, the first electrode layer 316 and the second electrode layer 320 are connected around the periphery part of the first electrode layer 316. In the fourth embodiment, the first electrode layer 316 formed to have an island-pattern (dot-pattern) connects with the second electrode layer 320 at the whole area of the first electrode layer 316. Accordingly, connection part of the first electrode layer 316 and the second electrode layer 320 is different between the third embodiment and the fourth embodiment.

(Result)

Driving voltage, luminous intensity and reliability of each device in the third embodiment and the fourth embodiment are measured. Also, those characteristics of (1) a conventional device in which a Rh electrode is formed on a p-type GaN layer, (2) a conventional device in which a Rh electrode is formed above a p-type GaN layer and a thin film layer made of Ni is formed between the p-type GaN layer and the Rh electrode, and (3) a device disclosed in Japanese Patent Application Laid-open No. 2004-71655 and in which Ag is formed on the Rh having an island-pattern (dot-pattern) are measured to compare with the device of the present embodiments. Results are shown in FIG. 17.

As shown in FIG. 17, materials and structure of the electrode in the present invention are comprehensively excellent in electricity, optics, and reliability compared with other devices in comparative examples. Here, FIG. 17 shows relative values when each measurement values of each characteristic of the devices in the third and the fourth embodiments is normalized to 1.0.

INDUSTRIAL AVAILABLENESS

The present invention can be applied to a light-emitting equipment such as a light-emitting device, a light-emitting device chip, an LED lump, and a display unit. The present invention is extremely useful for improving external quantum efficiency of the light-emitting equipment and also useful for enlarging luminous output efficiency compared at the same input electric power.

The present invention has been described in detail with reference to the above embodiments serving as most practical and appropriate examples. However, the present invention is not limited to these embodiments, and appropriate modifications and applications can be made without deviating from the scope of the present invention.

While the present invention has been described with reference to the above embodiments as the most practical and optimum ones, the present invention is not limited thereto, but may be modified as appropriate without departing from the spirit of the invention.

The present invention comprises all the contents in the priority claiming Japanese patent applications No. 2004-288880 and No. 2004-284075.

The invention claimed is:

1. A flip-chip type light emitting semiconductor device which comprises a light-transmitting substrate, a semiconductor layer deposited on said light-transmitting substrate, and an n-electrode and a p-electrode formed at the semiconductor layer side against said light-transmitting substrate, and which radiates light from said light-transmitting substrate side, comprising:

a contact layer which is the uppermost layer of said semiconductor layer;

a first electrode layer which is formed on said contact layer and supplies electric current to said contact layer;

an insulation protection film which is formed on said first electrode layer and transmits light;

a reflection film which is formed on said insulation protection film, made of metal and has high reflectivity to light; and a second electrode layer which is formed on said reflection film and contacts to at least a portion of said first electrode layer.

2. A light-emitting semiconductor device according to claim 1, wherein said first electrode layer comprises a transparent conductive film which is transparent to light.

3. A light-emitting semiconductor device according to claim 2, wherein said transparent conductive film has an exposed portion on which said insulation protection film is not formed at least a portion around a periphery part of said transparent conductive film and a portion of said second electrode layer is formed on the exposed portion.

4. A light-emitting semiconductor device according to claim 2, wherein the portion around said reflection film is covered by said insulation protection film.

5. A light-emitting semiconductor device according to claim 2, wherein said transparent conductive film comprises indium tin oxide (ITO).

6. A light-emitting semiconductor device according to claim 1, wherein said insulation protection film comprises at least one of silicon oxide and silicon nitride.

7. A light-emitting semiconductor device according to claim 1, wherein said reflection film comprises at least one of aluminum, silver, aluminum alloy, and silver alloy.

8. A light-emitting semiconductor device according to claim 1, wherein said second electrode layer comprising at least one of gold, a multiple layer of gold and titanium and an alloy comprising gold and titanium.

9. A light-emitting semiconductor device according to claim 1, wherein said first electrode layer is formed to expose a portion of said contact layer.

10. A light-emitting semiconductor device according to claim 1, wherein said reflection film has larger reflectivity with respect to wavelength of said light than said first electrode layer.

11. A light-emitting semiconductor device according to claim 9, wherein said second electrode layer is insulated from said reflection film and is electrically connected to said first electrode layer.

12. A light emitting semiconductor device according to claim 1, wherein said insulation protection film comprises at least one layer or multiple layers selected from $SiO_2$, $Al_2O_3$, SiN, $TiO_2$, $ZrO_2$, and SOG.

13. A light-emitting semiconductor device according to claim 1, wherein said second electrode layer is made of a metal which does not include metal comprised in said reflection film.

14. A light-emitting semiconductor device according to claim 1, wherein said contact layer is a p-type gallium nitride based compound semiconductor and said first layer comprises at least one metal selected from Rh, Pt, Pd, Ir, and Ru.

15. A light-emitting semiconductor device according to claim 9, wherein said first electrode layer is formed in at least one kind or a combination of a grid-like pattern, an island-like pattern (dot-like pattern), and a stripe-like pattern.

* * * * *